United States Patent [19]

Yumoto

[11] Patent Number: 4,908,259
[45] Date of Patent: Mar. 13, 1990

[54] MOLDED ARTICLE WITH PARTIAL METAL PLATING AND A PROCESS FOR PRODUCING SUCH ARTICLE

[75] Inventor: Tetsuo Yumoto, Tokorozawa, Japan

[73] Assignee: Sankyo Kasei Kabushiki Kaisha, Tokyo, Japan

[21] Appl. No.: 180,923

[22] Filed: Apr. 13, 1988

Related U.S. Application Data

[63] Continuation-in-part of Ser. No. 109,353, Oct. 15, 1987, Pat. No. 4,812,275.

[30] Foreign Application Priority Data

Nov. 18, 1986 [JP] Japan ................... 61-273035

[51] Int. Cl.⁴ .............................................. B32B 9/00
[52] U.S. Cl. ................................... 428/209; 428/409; 428/419; 428/457; 428/458; 428/474.4; 428/474.7; 428/704; 428/901; 428/131; 428/141; 361/397; 174/250
[58] Field of Search .............. 427/96, 98; 264/129; 428/131, 209, 409, 901, 457, 458, 474.4, 474.7, 704, 419, 141; 156/659.1, 663.1, 625, 629, 630, 654, 655; 361/397; 174/68.5

[56] References Cited

U.S. PATENT DOCUMENTS

| | | | |
|---|---|---|---|
| 3,259,559 | 7/1966 | Schneble Jr. et al. | 427/98 |
| 3,884,704 | 5/1975 | Rantell et al. | 427/98 |
| 4,389,771 | 6/1983 | Cassidy et al. | 174/68.5 |
| 4,451,505 | 5/1984 | Jans | 427/98 |
| 4,574,031 | 3/1986 | Dorey II et al. | 427/96 |
| 4,812,275 | 3/1989 | Yamoto | 264/129 |

Primary Examiner—Ellis P. Robinson
Assistant Examiner—P. J. Ryan
Attorney, Agent, or Firm—Jordan and Hamburg

[57] ABSTRACT

This invention relates to a partially plated molded article and to a process for the production of a molded article which is partially plated with metal such as circuit boards, connectors, decorative articles, etc., where a catalyst such as palladium, gold, etc. is added after the roughing of the surface of the primary molded article, and then, the molded article is inserted into the mold and molded so that the portions to be plated with metal are exposed, and after such molding, the exposed portions are plated with metal.

7 Claims, 3 Drawing Sheets

MOLDED ARTICLE WITH PARTIAL METAL PLATING AND A PROCESS FOR PRODUCING SUCH ARTICLE

This is a continuation-in-part application of U.S. Ser. No. 109,353, filed Oct. 15, 1987 now U.S. Pat. No. 4 812 275.

FIELD OF THE INVENTION AND RELATED ART STATEMENT

The present invention relates to a molded article with partial metal plating and to a process for the production of such molded article such as a circuit board, connector, etc.

A process for the production of molded articles having partial plating has been disclosed in Japanese Patent Application laying-open No. 61-239694 which has been filed on the basis of U.S. patent application Ser. No. 704,440. This Japanese application specifies several production processes of which two processes will be explained as follows.

The first process for production includes a molding process of the molded articles, an adhesion promotion process and an adherent metal plating process.

In the molding process of the molded article, an alternate two shot injection molding is used. In the first shot, the first portion of the molded article equipped with a circuit pattern is molded by using a first electrically insulating material, while in the second shot, the supporting structure is formed around the circuit pattern by using a second electrically insulating material. Polyethersulfone with catalyst is used as the first electrically insulating material for forming the molded article, and the appropriate catalyst for filler material is palladium catalyst scattered on powdered aluminium silicate. The catalyst mixed in the electrically insulating material is catalytic for the material for electroless metal plating to be conducted in the adhesive metal plating. The desirable second electrically insulating material to be selected for the supporting structure is polyethersulfone (without a catalyst).

In the adhesion promotion process, the surfaces of the molded article are made micro porous and hydrophilic and the catalyst on the surface part of the circuit pattern and hole walls are exposed. Accordingly, all the flat, smooth and glittering surfaces of the molded article are matted. Further, in the metal plating process, the molded article is passed through the vapor of dichloromethane, and the matted hydrophilic surfaces of the support structure will be made flat, smooth and hydrophobic so that they can endure the metal plating from outside and once again will be returned to the metal plating solution. The reason why these kinds of processes are required is to avoid non-uniform dispersal of the application catalyst, and avoid having the surface layers of the circuit pattern from becoming rich with the resin portion such that the catalytic function of the surfaces are not brought into full play.

In the second production process the molded articles are formed by a two shot process, where not only the first electrically insulating material to be used is the first shot process for forming the circuit pattern, but also the second electrically insulating material to be used in the second shot molding process for molding the support structure are selected from a material having no catalyst. The molded articles are treated with etching solution for adhesion promotion, then catalyst for metal plating is added and further is activated for electroless metal plating, and then non-adhesive catalyst is washed away from the support structure, and finally the circuit pattern is subjected to copper plating by using a solution for electroless copper plating.

Both processes mentioned above involve the following problems.

The first problem in the production process of the former case is that palladium catalyst is mixed into the first electrically insulating material for forming the circuit pattern. Palladium is an expensive precious metal. It needs to be mixed in a large quantity in order to cause it to conduct as a catalytic function for electroless metal plating, and accordingly, economical production is difficult. The second problem is that the former case makes the production process complicated and deteriorates the working efficiency, since the process for making the matted surfaces flat and smooth is needed to be included in the metal plating process in addition to the need of the process to make a mat on all the smooth surfaces of the articles in order to expose the catalyst.

The problem in the production process of the latter case is that it requires work to wash away with spray the catalyst adhered to the portions other than the circuit pattern, that is to say, all the surfaces of the support structure, after activation of the molded articles but before electroless copper plating. It is time-consuming to ensure the removal of the catalyst. Especially, the work to wash away the catalyst adhering to the surface of the border portion of the circuit pattern and support structure takes a great deal of time, labor, and expense and is practically difficult. In a case when the removal of the catalyst is incomplete in the molded articles, for instance, in the circuit boards, the portions other than the circuit portions will be sure to get metal plated, and the insulation of these portions are not secured. Therefore, they will not function as circuit boards.

OBJECT AND SUMMARY OF THE INVENTION

The present invention involves a process to mold the primary molded article 1, a process for conducting pre-treatment of the primary molded article by adding such catalyst as palladium, gold, silver, platinum, etc. after roughing of the surfaces of the primary molded article, a process for forming a secondary molded article 2 where the portions 1a of the primary molded article to be plated with metal by using plastic material and a mold on the base of the pre-treated primary molded article are exposed, and the process for plating the secondary molded article with metal.

In addition to plastics, also ceramics etc. can be used as raw material for forming the primary and the secondary molded articles. The plastics material includes not only single plastics material, but also those mixed with filler such as glass fibre, potassium titanate fibre, and so on. The pre-treatment mentioned above can be done by using a publicly known process. In case when the surfaces of the primary molded article are soiled with mold removing agent or fatty substance after forming of the primary molded article, it is advisable to conduct the removal of fat. Depending on the kind of plastics, for instance in the case of the primary molded article composed of polyamide resin, the fat can be removed by means of such organic solvents as methylethyl ketone, acetone, surface active agent, etc. Meantime, a variety of etching solutions are used in the pre-treatment process in order to improve the adhesion power of the plated metal. In the case of the article made of polyphenylene sulphide resin, such etching solutions as chromic acid/sulfuric acid, acidic ammonium fluoride/nitric acid and hydrofluoric acid/nitric acid are suitable.

In the case when the primary molded article is made of plastic material, the way of adding catalyst can be selected as a practical one from a catalyst→accelerator method and a sensitizing→activating method. The former is the method for separating palladium on the surface of the primary molded article by activating with such acid as hydrochloric acid, sulfuric acid, etc. after submerging or dipping in the mixed catalytic solution of the family of tin and palladium. The latter is the method, where, at first, a relatively strong reducing agent such as tin chloride, hypophosphorous acid, hydrazinium chloride, etc. is adsorbed on the surfaces of the molded article, then the article is submerged or dipped in the catalytic solution that contains ions of precious metal such as gold and palladium and finally the precious metal is separated on the surfaces of the molded article. It is usual for chemical copper plating or chemical nickel plating to be used in the metal plating process of the secondary molded article 2. However, if the molded article is a wiring board, the desirable process will be a copper plating.

An object of this invention is to provide an efficient and economical mass production process for partially metal plated, molded articles which can function as circuit boards, connectors, etc., and which can also function as decorative articles.

Another object of this invention is to make the plating with a minimal quantity of precious metal as possible by applying the catalyst only to the surfaces of the primary molded article.

A further object of this invention is to abolish the process for washing away the catalyst and to improve the production efficiency by using the mold for forming the secondary molded article where the portions of the primary molded article bestowed with catalyst and to be metal plated are exposed.

Another object of this invention is to make it possible to secure the complete insulation of the portions other than the circuit portions in case when the molded article is, for instance, a circuit board.

Another object of the present invention is to provide a plastic molded article with a strong bond between a primary molded article and a secondary molded article while avoiding creating a gap between them even after a change of thermal environment, while being free from entry of metal plating electrolyte during the plating process, for example, or from cleaning liquid during the cleaning process, and avoiding an aging problem resulting from said plating electrolyte or cleaning liquid entering any such potential gap and which reversely flows out while corroding the plated metal or permitting moisture to enter such potential gap and deteriorating the quality of the product.

Another object of the present invention is to expand the application of the plastic molded product, the molded article not only having a decoration application such as a button but also being functional as a plastic molded article, such as printed circuit boards and connectors while reducing manufacturing cost and improving the quality thereof.

The special features of this invention will be more fully understood with the explanation made as follows on the basis of the drawings.

DESCRIPTION OF THE PREFERRED EMBODIMENTS

Example 1

Primary molding process

Figure 1:
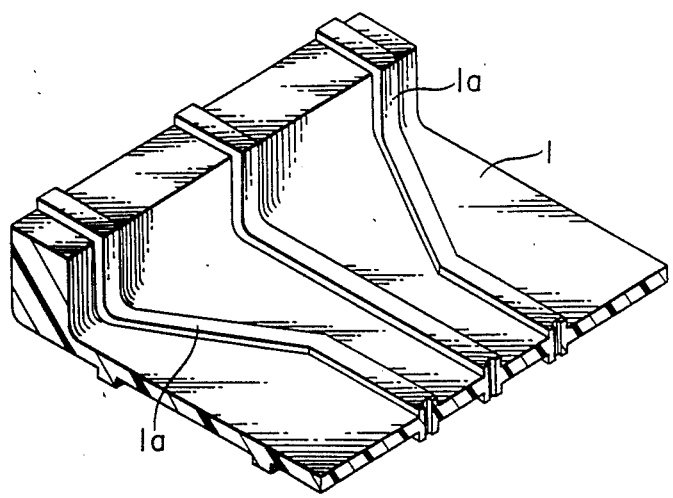
FIG. 1 is a perspective view of a circuit board as a primary molded article.

Board 1 as shown in FIG. 1 was molded as a primary molded article by using a mold. A protruding pattern 1a was formed on the board.

Etching was conducted by submerging or dipping the board 1 for 5 minutes in an etching solution composed of acidic ammonium fluoride/nitric acid, at a temperature of about 40° C., after subjecting the board 1 to a fat removing treatment.

After washing the board with water, a sensitizing with tin chloride and activation with palladium chloride were carried out and, after that, the board was dried.

Secondary molding process

Figure 2:
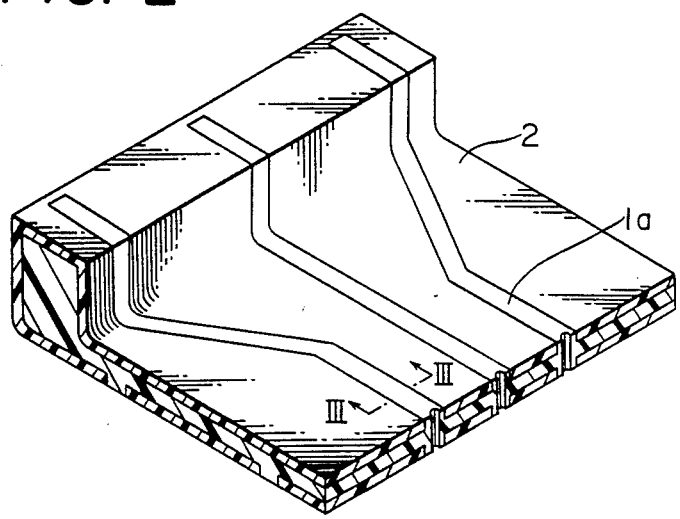
FIG. 2 is a perspective view of a circuit board as a secondary molded article.
Figure 3:
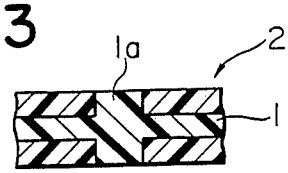
FIG. 3 is an enlarged sectional view taken along the line III—III in FIG. 2.
Figure 4:
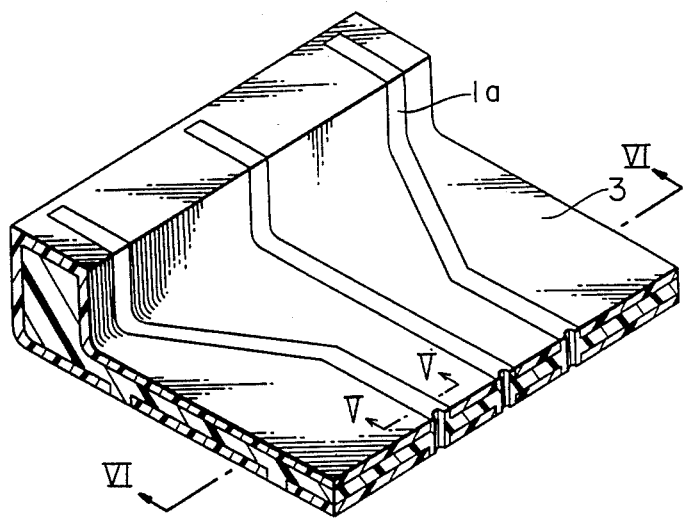
FIG. 4 is a perspective view of a circuit board as a product having partial metal plating.
Figure 5:
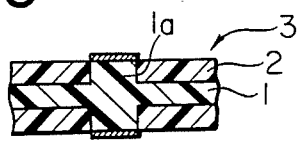
FIG. 5 is an enlarged sectional view taken along the line V—V in FIG. 4.
Figure 6:
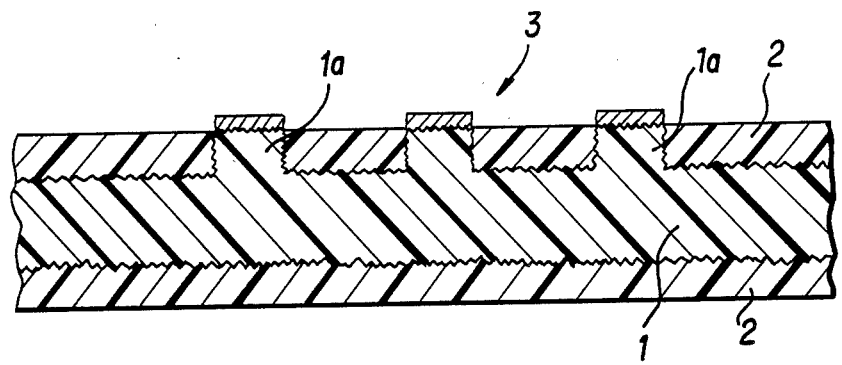
FIG. 6 is another sectional view yet further enlarged taken along the line VI—VI in FIG. 4.

After drying, the board 1 was inserted into the cavity of the mold, then the cavity was filled with liquid plastic resin and the board 2 as the secondary molded article was formed as shown in FIG. 2. As shown in FIG. 3, the pattern 1a of the board 1 protrudes outwards in the board 2. After the board 2 was subjected to a fat removing treatment, an electroless metal plating was conducted to a thickness of 20 μm. By doing so, the circuit board 3 was obtained as a molded plastic article, where the pattern 1a alone out of the outer surface of the board was plated with metal as shown in FIG. 4 and FIG. 5.

In both the primary and secondary molding processes, a thermoplastic resin mixture composed of 60 weight % of polyphenylene sulphide resin, 35 weight % of glass fibre and 5 weight % of potassium titrate fibre (Timos D made by Otsuka Chemical) was used as raw material for the circuit board.

Example 2

The circuit board 3 was produced in the same way as Example 1. However, as raw material for the circuit board, a thermoplastic resin mixture composed of 70% of polyethersulphone resin and 30% of glass fibre was used.

The measurement of the adhesion state of the metal plated circuit pattern of each of Examples 1 and 2 proved that the adhering strength was strongest in the case of Example 1.

The molded article of this invention comprises the plastic primary molded article 1 whose entire surface is roughened, the plastic secondary material product 2 which is joined integratedly with the plastic primary molded article in such a manner that only the particular part 1a of the primary molded product is exposed and the metal plated on the part 1a.

Although the raw material used for the primary molded article is a material suitable for plating metal, the secondary molding is processable even with the same type of plastic material without needing to select a special secondary molding material, e.g. material not easily metal plated. Consequently, there is a great deal of freedom in selecting a plastic material for molding. Even if the thermal environment may change for the plastic molded article, gaps will not be easily created between the primary and the secondary molded articles.

Also, because the entire surface of the primary molded article is roughened, the same type of plastic is selectable to mold thereon, resulting in higher adhesion between the primary and secondary molded articles. Therefore, the durability of the molded article can be improved because the plating electrolyte, moisture, etc. will not enter between the primary and secondary molded articles.

The method of the invention is applicable to three dimensional shapes, not limited only to plate shape (two dimensional form). Thus, the method is also applicable to products other than printed circuit boards and electronic parts. In addition, even where a filler such as glass fiber is mixed in the molding material in order to improve the heat resistance or strength, a product having partial plating can be manufactured at low cost and high yield with or without the filler.

What I claim is:

1. A partially metal-plated molded product comprising a plastic primary molded article having an outer surface, protrusions extending from said outer surface, said outer surface and said protrusions having a roughened etched surface formed by etching in an acid, a catalyst disposed on said roughened etched surface, a plastic secondary molded article disposed about said primary molded article, said secondary molded article having an external surface with through openings in which are disposed said protrusions of said primary molded article, said protrusions having exposed external faces, and plated metal on said external faces of said protrusions.

2. A partially metal-plated molded product according to claim 1 wherein said catalyst is selected from the group consisting of palladium, gold, silver and platinum.

3. A partially metal-plated molded product according to claim 1 wherein said plastic primary and secondary molded articles are selected from the group consisting of polyamide, polyphenylene sulphide, and polyethersulfone.

4. A partially metal-plated molded product according to claim 3 wherein said plastic primary and secondary molded articles further comprise a filler selected from the group consisting of glass fiber and potassium titanate fibers.

5. A partially metal-plated molded product according to claim 1 wherein said exposed external surfaces are planar with said external surface of said secondary molded article, said exposed external surfaces being a roughened surface, said exposed external surface having said catalyst disposed thereon.

6. A partially metal-plated molded product made according to the process of molding a plastic primary article having protrusions, roughening the surface of said primary molded article, treating the roughened surface of said primary article with a catalyst, molding a plastic secondary molded article about said first primary molded article such that outer surfaces of said protrusions are exposed, and plating said exposed outer surface with metal.

7. A partially metal-plated molded article comprising a plastic primary molded article having an outer surface, protrusions extending from said outer surface, roughening means on said outer surface and on said protrusions of said primary molded article, a plastic secondary molded article disposed about said primary molded article, said secondary molded article having an external surface with through openings in which are disposed said protrusions of said primary molded article, said protrusions having exposed external faces, and plated metal on said external faces of said protrusions.

* * * * *